(12) United States Patent
Tung et al.

(10) Patent No.: US 9,024,836 B2
(45) Date of Patent: ***May 5, 2015

(54) ELECTRONIC DEVICE FOR PROCESSING RADIO FREQUENCY SIGNALS AND MATCHING CIRCUIT FOR PROVIDING VARIABLE IMPEDANCE

(75) Inventors: Wei-Shin Tung, Taoyuan (TW);
Yu-Meng Yen, Taoyuan (TW);
Chen-Fang Tai, Taoyuan (TW);
Pei-Zong Rao, Taoyuan (TW);
Wan-Ming Chen, Taoyuan (TW)

(73) Assignee: HTC Corporation, Taoyuan (TW)

( * ) Notice: Subject to any disclaimer, the term of this patent is extended or adjusted under 35 U.S.C. 154(b) by 295 days.

This patent is subject to a terminal disclaimer.

(21) Appl. No.: 13/595,552

(22) Filed: Aug. 27, 2012

(65) Prior Publication Data

US 2013/0099993 A1  Apr. 25, 2013

Related U.S. Application Data

(63) Continuation-in-part of application No. 13/282,134, filed on Oct. 26, 2011, now Pat. No. 8,717,248.

(60) Provisional application No. 61/550,051, filed on Oct. 21, 2011.

(51) Int. Cl.
*H01Q 1/50* (2006.01)
*H01Q 5/00* (2006.01)
*H03H 7/38* (2006.01)

(52) U.S. Cl.
CPC ............... *H01Q 5/0041* (2013.01); *H03H 7/38* (2013.01)

(58) Field of Classification Search
USPC ........... 343/702, 850, 860, 861; 333/17.3, 32; 455/77
See application file for complete search history.

(56) References Cited

U.S. PATENT DOCUMENTS

| 4,564,843 A | 1/1986 | Cooper | |
|---|---|---|---|
| 2011/0057745 A1* | 3/2011 | Ando | 333/104 |
| 2013/0038507 A1* | 2/2013 | Hamabe | 343/893 |
| 2013/0154735 A1* | 6/2013 | Hase | 330/192 |

* cited by examiner

*Primary Examiner* — Tan Ho
(74) *Attorney, Agent, or Firm* — Birch, Stewart, Kolasch & Birch, LLP

(57) ABSTRACT

An electronic device includes an antenna, an RF circuit, and a matching circuit. The matching circuit is configured to provide variable impedance between the antenna and the RF circuit, wherein the matching circuit includes a first element having a first terminal and a second terminal, and wherein the first terminal is coupled to the antenna; a second element having a third terminal connected to the second terminal of the first element and a fourth terminal coupled to the RF circuit; a first tuning cell connected to the second terminal of the first element and the third terminal of the second element, and comprising a first tuning element, a second tuning element and a first control element, wherein the first control element determines whether to make a first node connected between the first and second tuning elements couple to a voltage level.

16 Claims, 12 Drawing Sheets

ELECTRONIC DEVICE FOR PROCESSING RADIO FREQUENCY SIGNALS AND MATCHING CIRCUIT FOR PROVIDING VARIABLE IMPEDANCE

CROSS REFERENCE TO RELATED APPLICATIONS

This application is a Continuation-In-Part of application Ser. No. 13/282,134, filed Oct. 26, 2011, the entirety of which is incorporated by reference herein, and further claims the benefit of U.S. Provisional Application No. 61/550,051, filed on Oct. 21, 2011, the entirety of which is incorporated by reference herein.

BACKGROUND OF THE INVENTION

1. Field of the Invention

The disclosure generally relates to an electronic device and a matching circuit, and more particularly, relates to an electronic device for processing radio frequency (RF) signals and a matching circuit for providing variable impedance.

2. Description of the Related Art

Compact portable devices usually have smaller antennas, resulting in poor antenna performance and OTA (Over-The-Air) performance. There are two main methods to solve the problem. One is to enhance antenna efficiency, and the other is to increase antenna bandwidth.

FIG. 1 is a diagram illustrating a traditional matching circuit 100 with variable impedance. As shown in FIG. 1, an antenna 102 is coupled to the matching circuit 100, which includes inductors 104, 110 and variable capacitors 106, 108. With different capacitances, the variable capacitors 106, 108 are the primary tuning elements to increase the antenna bandwidth. Different capacitances can be obtained according to controlled voltages of the variable capacitors 106, 108. However, the impedance of the matching circuit 100 cannot be tuned by the inductors 104, 110, such that freedom of design is limited.

Furthermore, U.S. Pat. No. 4,564,843, "Antenna with P.I.N. diode switched tuning inductors", discloses a tuned radio antenna for a frequency agile communication system. According to FIG. 2 of the patent disclosure, the tuned radio antenna has a plurality of tuning inductors in series with a short-circuiting switch for each inductor. The plurality of tuning inductors are configured to provide variable impedance. However, each tuning inductor has small inner resistance. When coupled in series, all resistance of these tuning inductors is summed up. The total resistance increases signal transmission loss.

BRIEF SUMMARY OF THE INVENTION

In one exemplary embodiment, the disclosure is directed to an electronic device for processing radio frequency (RF) signals, which comprises an antenna, an RF circuit, and a matching circuit configured to provide variable impedance between the antenna and the RF circuit, wherein the antenna is capable of operating in a first frequency band or a second frequency band according to the variable impedance. The matching circuit comprises a first element having a first terminal and a second terminal, wherein the first terminal is coupled to the antenna; a second element having a third terminal connected to the second terminal of the first element and a fourth terminal coupled to the RF circuit; a first tuning cell connected to the second terminal of the first element and the third terminal of the second element. The first tuning cell comprises a first tuning element, a second tuning element and a first control element, wherein the first control element determines whether to make a first node connected between the first and second tuning elements couple to a voltage level according to a first control signal; and a selecting circuit coupled to the first control element and configured to generate the first control signal so as to adjust the variable impedance.

In another exemplary embodiment, the disclosure is directed to a matching circuit configured to provide variable impedance between an antenna and an RF circuit. The matching circuit comprises a first element having a first terminal and a second terminal, wherein the first terminal is coupled to the antenna; a second element having a third terminal connected to the second terminal of the first element and a fourth terminal coupled to the RF circuit; a first tuning cell connected to the second terminal of the first element and the third terminal of the second element. The first tuning cell comprises a first tuning element, a second tuning element and a first control element, wherein the first control element determines whether to make a first node connected between the first and second tuning elements couple to a voltage level according to a first control signal; and a selecting circuit coupled to the first control element and configured to generate the first control signal so as to adjust the variable impedance.

In one exemplary embodiment, the disclosure is directed to an electronic device for processing radio frequency (RF) signals, comprising: an antenna; an RF circuit; and a matching circuit configured to provide variable impedance between the antenna and the RF circuit, wherein the antenna is capable of operating in multiple frequency bands according to the variable impedance, and wherein the matching circuit comprises: a first cell coupled between the antenna and the RF circuit; a tuning cell coupled to the first cell and comprising a first tuning element, a second tuning element and a control element, wherein the control element determines whether to make a first node connected between the first and second tuning elements couple to a voltage level according to a first control signal; and a selecting circuit coupled to the control element and configured to generate the first control signal to adjust the variable impedance.

In another exemplary embodiment, the disclosure is directed to a matching circuit for providing variable impedance between an antenna and an RF circuit, comprising: a first element coupled between a first node and a second node, wherein the first node is coupled to the antenna and the second node is coupled to the RF circuit; a first blocking capacitor coupled between the first node and a third node; a second blocking capacitor coupled between the second node and a fourth node; a first diode having an anode coupled to the third node and a cathode coupled to a fifth node; a second element coupled between the fourth node and the fifth node; a first RF choking inductor coupled to the third node, and receiving a control signal; a selecting circuit coupled to the first RF choking inductor, and generating the control signal to adjust the variable impedance; and a third element coupled to the second node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
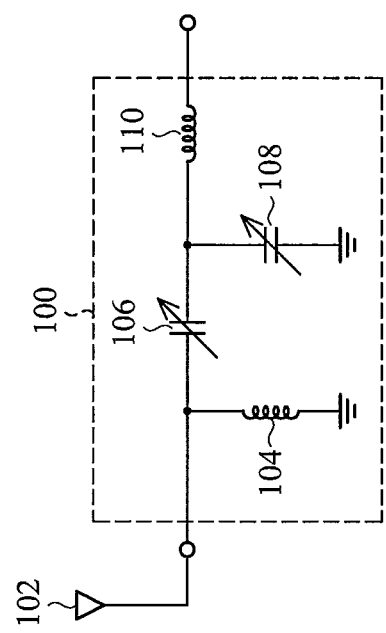
FIG. 1 is a diagram illustrating a traditional matching circuit with variable impedance.
Figure 2A:
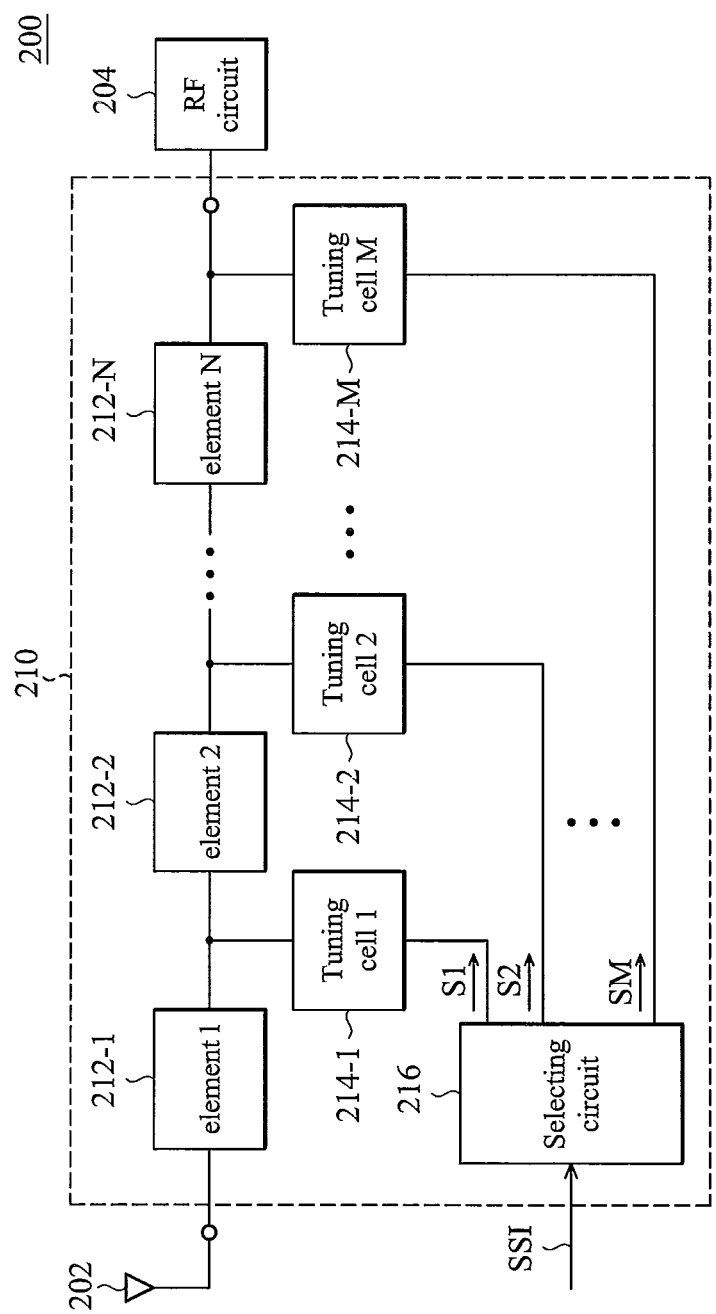
FIG. 2A is a diagram illustrating an electronic device according to an embodiment of the invention.

FIG. 2A is a diagram illustrating an electronic device 200 according to an embodiment of the invention. As shown in FIG. 2A, the electronic device 200 comprises an antenna 202, an RF circuit 204, and a matching circuit 210. The matching circuit 210 is electrically connected between the antenna 202 and the RF circuit 204, and comprises a plurality of elements 212-1, 212-2, ..., 212-N, one or more tuning cells 214-1, 214-2, ..., 214-M, and a selecting circuit 216, wherein N is an integer which is greater than or equal to 2, M is an integer which is greater than or equal to 1, and N is greater than or equal to M. Each of the plurality of elements 212-1, 212-2, ..., 212-N may comprise one or more electronic components, such as capacitors, inductors, or resistors. The selecting circuit 216 may transmit one or more control signals S1, S2, ..., SM according to a setting signal SSI or a default value so as to adjust impedances of the one or more tuning cells 214-1, 214-2, ..., 214-M, respectively. Therefore, the matching circuit 210 can provide variable impedance between the antenna 202 and the RF circuit 204. It is noted that each of the one or more control signals S1, S2, ..., SM may comprise one or more sub-signals. For example, the control signal S1 may comprise sub-signals S1-1, S1-2. The antenna can be operated in a plurality of frequency bands, such as 3G, LTE (Long Term Evolution), DCS (Distributed Control System) Band, or WCDMA (Wideband Code Division Multiple Access) BC1, according to the variable impedance of the matching circuit 210.

Figure 2B:
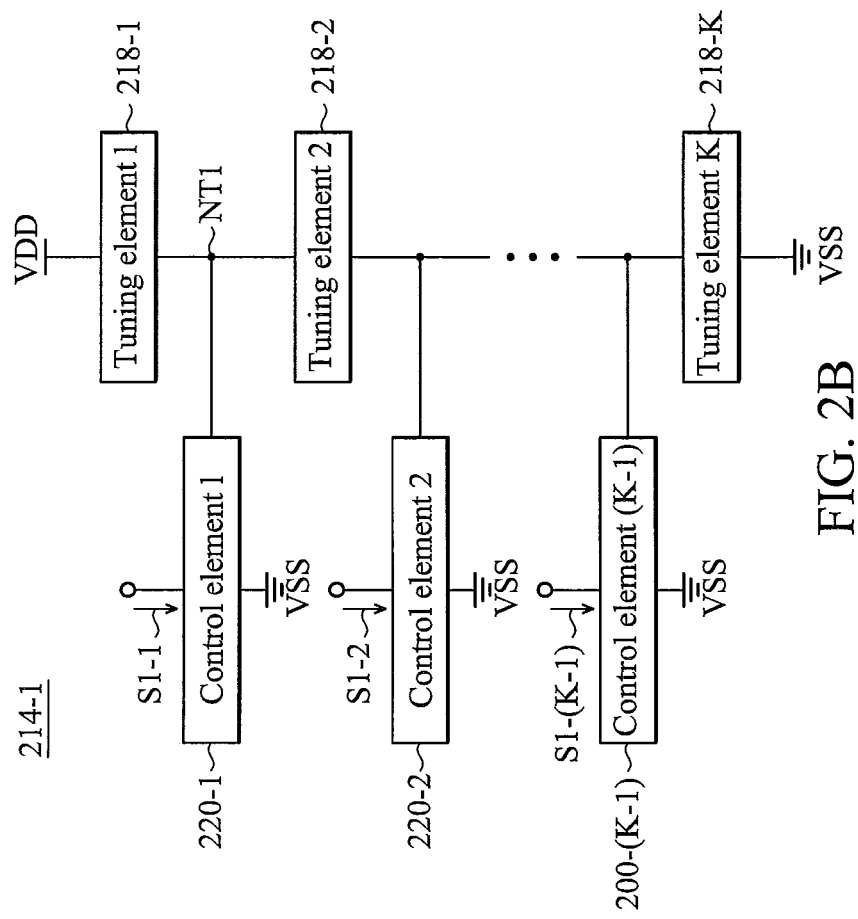
FIG. 2B is a diagram illustrating a tuning cell according to an embodiment of the invention.

FIG. 2B is a diagram illustrating the tuning cell 214-1 according to an embodiment of the invention. As shown in FIG. 2B, the tuning cell 214-1 comprises a plurality of tuning elements 218-1, 218-2, ..., 218-K and one or more control elements 220-1, 220-2, ..., 220-(K−1), wherein K is an integer that is greater than or equal to 2. The plurality of tuning elements 218-1, 218-2, ..., 218-K and the one or more control elements 220-1, 220-2, ..., 220-(K−1) are electrically coupled between a ground voltage VSS (e.g., 0V) and a work voltage VDD (e.g., 1.8V or 3V). It is noted that each of the other tuning cells 214-2, ..., 214-M may comprise the same components as those of the tuning cell 241-1. The control signal S1, generated by the selecting circuit 216, comprises one or more sub-signals S1-1, S1-2, ..., S1-(K−1) for controlling the one or more control elements 220-1, 220-2, ..., 220-(K−1), respectively. For example, the control element 220-1 determines whether to make a node NT1, which is electrically connected between the tuning elements 218-1, 218-2, electrically connect to the ground voltage VSS according to the sub-signal S1-1. The control element 220-1 may be a switch or a diode. In one embodiment of the invention, if the sub-signal S1-1 is equal to the work voltage VDD, the control element 220-1 electrically connects the node NT1 to the ground voltage VSS, and if the sub-signal S1-1 is equal to the ground voltage VSS, the control element 220-1 does not electrically connect the node NT1 to the ground voltage VSS or opens the node NT1. The other control elements 220-2, ..., 220-(K−1) may have similar features to that of the control element 220-1, so they will not be described again.

Figure 3:
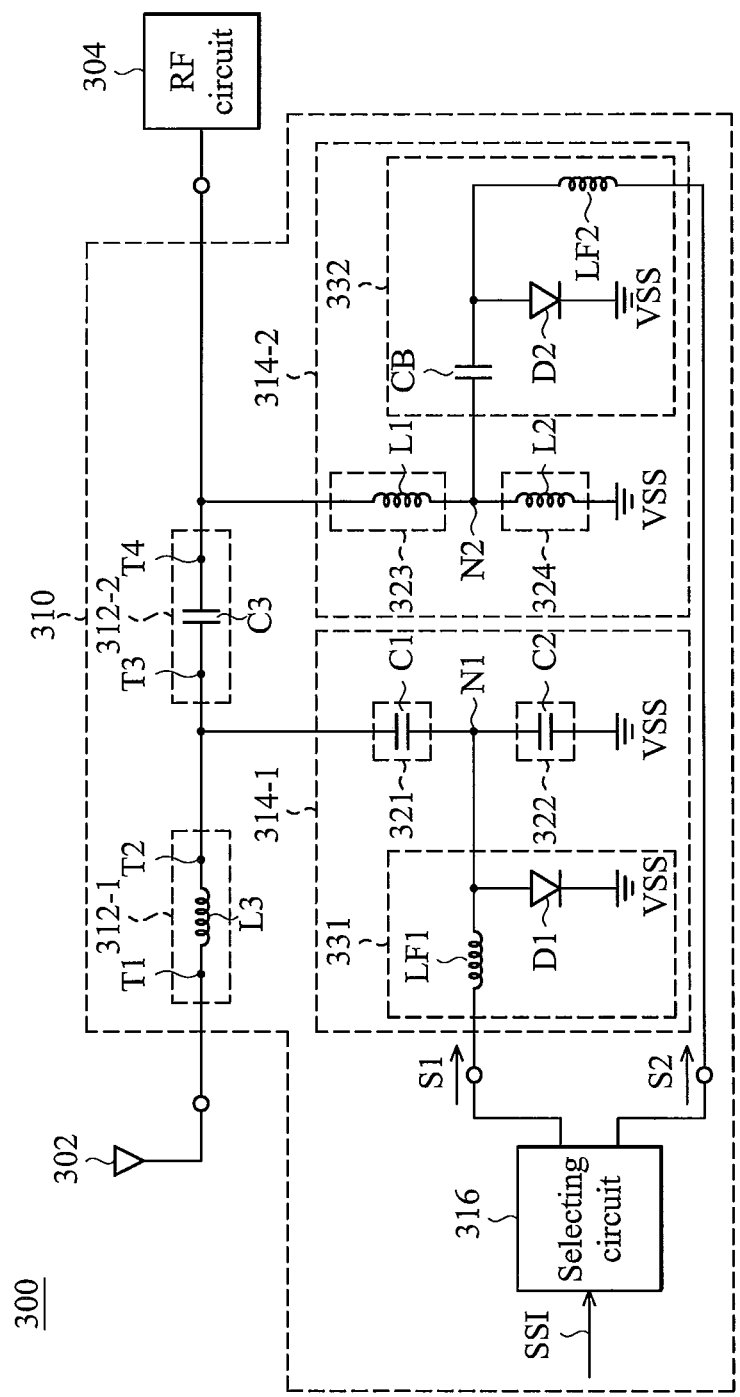
FIG. 3 is a diagram illustrating an electronic device according to an embodiment of the invention.

FIG. 3 is a diagram illustrating an electronic device 300 according to another embodiment of the invention. As shown in FIG. 3, the electronic device 300 comprises an antenna 302, an RF circuit 304, and a matching circuit 310.

The matching circuit 310 is configured to provide variable impedance between the antenna 302 and the RF circuit 304. The antenna 302 is capable of operating in at least a frequency band F1 or a frequency band F2 according to the variable impedance provided by the matching circuit 310. The matching circuit 310 comprises at least two elements 312-1, 312-2, at least one tuning cell 314-1, and a selecting circuit 316. The elements 312-1, 312-2 are electrically coupled between the antenna 302 and the RF circuit 304. The element 312-1 has two terminals T1 and T2, wherein the terminal T1 is coupled to the antenna 302. The element 312-2 has two terminals T3 and T4, wherein the terminal T3 is electrically connected to the terminal T2, and the terminal T4 is coupled to the RF circuit 304. Each of the elements 312-1, 312-2 may comprise one or more electronic components, such as capacitors, inductors, or resistors. The tuning cell 314-1 is electrically connected to the terminal T2 of elements 312-1 and the terminal T3 of the element 312-2, and comprises at least two tuning elements 321 and 322 and at least one control element 331. The control element 331 determines whether to make a node N1, which is electrically connected between the tuning elements 321 and 322, couple to a voltage level according to a control signal S1. In an embodiment, the voltage level is the ground voltage VSS. The selecting circuit 316 is configured to generate at least the control signal S1 according to a setting signal SSI or a default value so as to adjust the variable impedance of the matching circuit 310.

In some embodiments, the tuning elements 321 and 322 are two capacitors C1 and C2. The control element 331 comprises an RF choking inductor LF1 and a diode D1. The RF choking inductor LF1 is electrically connected to the node N1 and receives the control signal S1. Inductance of the RF choking inductor LF1 is greater than 33 nH, such as 56 nH, so as to block signals in high frequency bands. The diode D1 has an anode electrically connected to the node N1 and a cathode electrically connected to the voltage level. In an embodiment, the voltage level is the ground voltage VSS.

In another embodiment, the matching circuit 310 may further comprise another tuning cell 314-2 which is electrically connected to the terminal T4 of the element 312-2 and the RF circuit 304. Similarly, the tuning cell 314-2 comprises at least two tuning elements 323 and 324 and at least one control element 332. The control element 332 determines whether to make a node N2, which is electrically connected between the tuning elements 323 and 324, couple to the voltage level according to another control signal S2. In an embodiment, the voltage level is the ground voltage VSS. The selecting circuit 316 is further configured to generate the control signal S2 according to the setting signal SSI or the default value so as to adjust the variable impedance of the matching circuit 310.

In some embodiments, the tuning elements 323 and 324 are two inductors L1 and L2. The control element 332 comprises an RF choking inductor LF2, a diode D2, and a blocking capacitor CB. The RF choking inductor LF2 is coupled to the node N2 and receives the control signal S2. Inductance of the RF choking inductor LF2 is greater than 33 nH, such as 56 nH, so as to block signals in high frequency bands. The diode D2 has an anode coupled to the node N2 and a cathode electrically connected to the voltage level. In an embodiment, the voltage level is the ground voltage VSS. The blocking capacitor CB has one terminal connected to the node N2 and the other terminal connected to the RF choking inductor LF2 and the anode of the diode D2 so as to block DC signals.

The elements 312-1 may be an inductor L3, and the element 312-2 may be a capacitor C3.

It is noted that the tuning cells 314-1, 314-2 can be swapped with each other. In other words, the tuning cells 314-1 may be electrically connected to the element 312-2 and the RF circuit 304, and the tuning cell 314-2 may be electrically connected to the elements 312-1, 312-2. The matching circuit 310 may also comprise the same two tuning cells; that is, the tuning cell 314-1 is replaced with another tuning cell 314-2 or the tuning cell 314-2 is replaced with another tuning cell 314-1, so that the two tuning cells are identical.

In one embodiment of the invention, if the control signal S1 generated by the selecting circuit 316 is equal to the work voltage VDD, the diode D1 is turned on so as to electrically connect the node N1 to the ground voltage VSS, and if the control signal S1 is equal to the ground voltage VSS, the diode D1 is turned off so as not to electrically connect the node N1 to the ground voltage VSS. Similarly, if the control signal S2 generated by the selecting circuit 316 is equal to the work voltage VDD, the diode D2 is turned on (closed); and if the control signal S2 is equal to the ground voltage VSS, the diode D2 is turned off (open).

Figure 4:
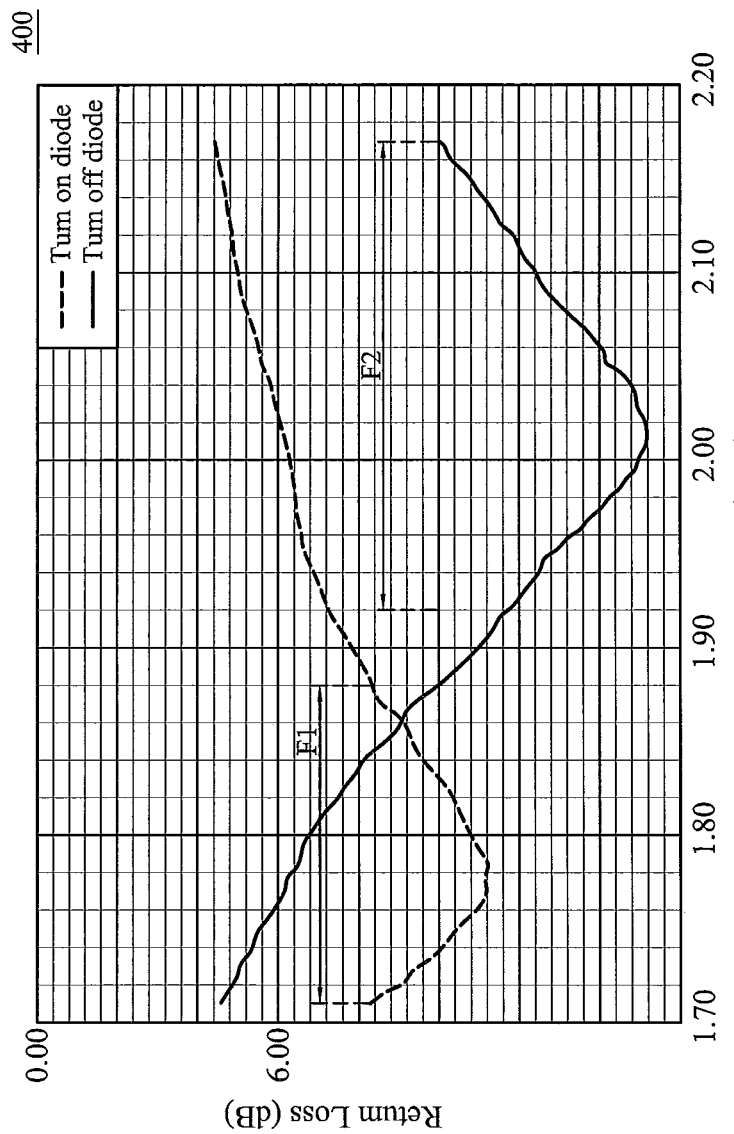
FIG. 4 is a diagram illustrating return loss of an antenna according to an embodiment of the invention.

FIG. 4 is a diagram 400 illustrating return loss of the antenna 302 according to an embodiment of the invention. FIG. 4 is utilized for illustrating measured return loss (unit: dB) over frequency (unit: GHz). If the control signals S1, S2 are both equal to the work voltage VDD, the diodes D1, D2 are both turned on, and the matching circuit 310 can provide first impedance so that the antenna 302 is operated in the frequency band F1, DCS Band, which is approximately from 1.71 GHz to 1.88 GHz. On the other hand, if the control signals S1, S2 are both equal to the ground voltage VSS, the diodes D1, D2 are both turned off, and the matching circuit 310 can provide a second impedance so that the antenna 302 is operated in the frequency band F2, WCDMA BC1, which is approximately from 1.92 GHz to 2.17 GHz.

Figure 5:
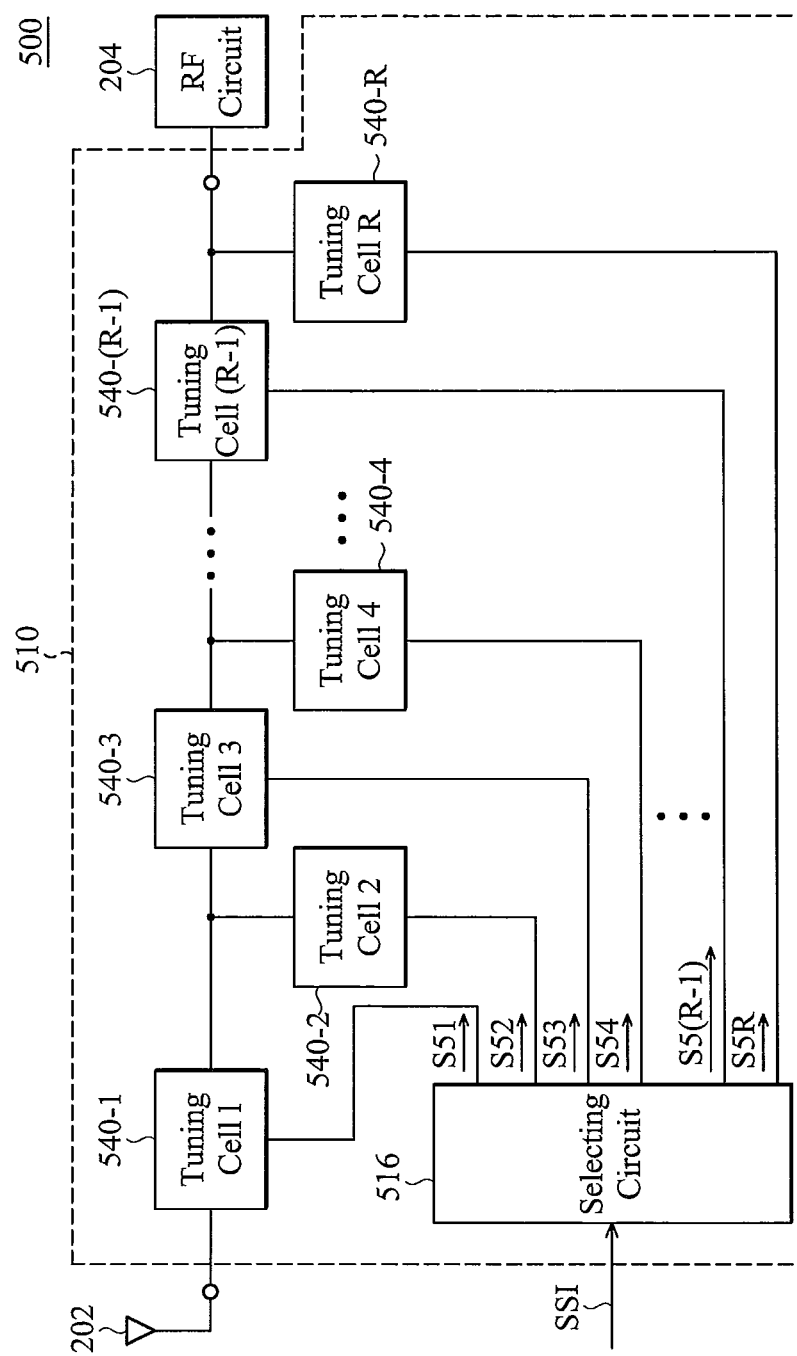
FIG. 5 is a diagram illustrating an electronic device according to another embodiment of the invention.

FIG. 5 is a diagram illustrating an electronic device 500 according to another embodiment of the invention. The electronic device 500 is similar to the electronic device 200 as shown in FIG. 2A. The difference between them is that a matching circuit 510 of the electronic device 500 comprises one or more tuning cells 540-1, 540-2, . . . , and 540-R, wherein R is an integer being greater than or equal to 1. The one or more tuning cells 540-1, 540-2, . . . , and 540-R may be all electrically coupled to a selecting circuit 516 so as to receive one or more control signals S51, S52, . . . , and S5R, respectively. Similarly, each of the one or more control signals S51, S52, . . . , and S5R may comprise one or more sub-signals. It is noted that the selecting circuit 516 is capable of adjusting impedance of each of the one or more tuning cells 540-1, 540-2, . . . , and 540-R via the control signals S51, S52, . . . , and S5R. Therefore, the matching circuit 510 can provide variable impedance between the antenna 202 and the RF circuit 204. Further, that increases design flexibility of the matching circuit 510 since each component of the matching circuit 510 has adjustable impedance which may be controlled by the selecting circuit 516.

Figure 6A:
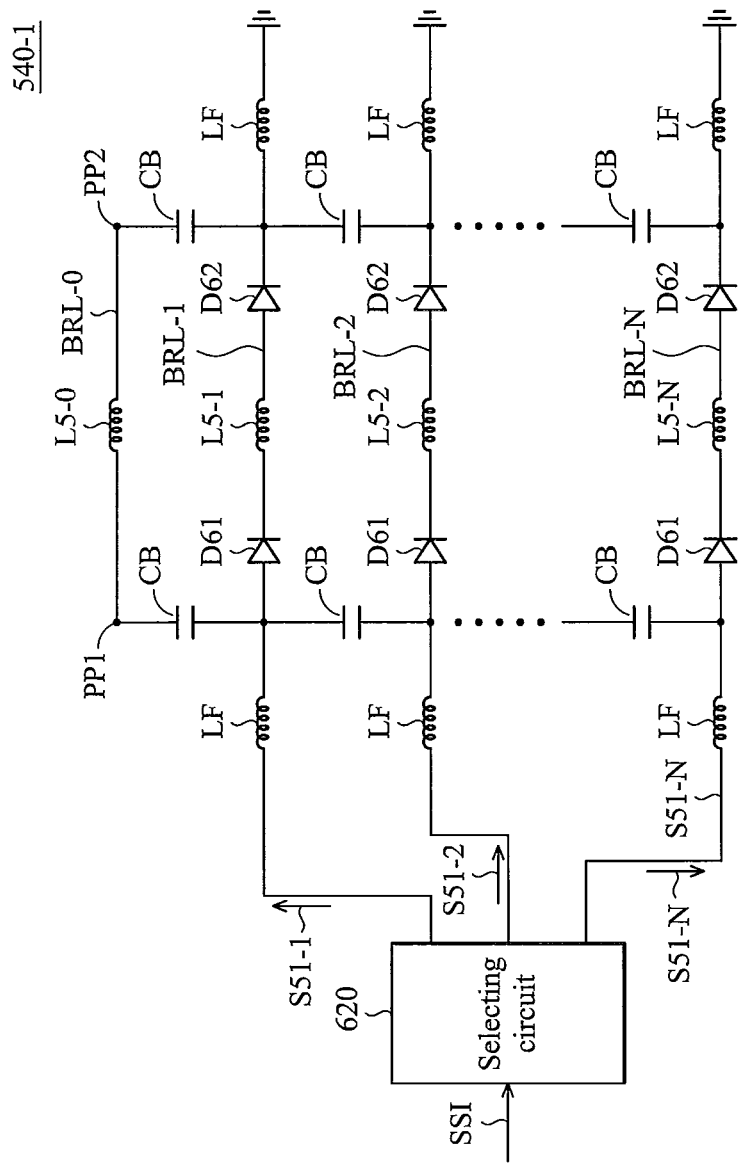
FIG. 6A is a diagram illustrating the tuning cell according to an embodiment of the invention.

FIG. 6A is a diagram illustrating the tuning cell 540-1 according to an embodiment of the invention. As shown in FIG. 6A, the tuning cell 540-1 may comprise a selecting circuit 620, a plurality of circuit branches BRL-0, BRL-1, . . . , and BRL-N, a plurality of RF choking inductors LF, and a plurality of blocking capacitors CB. In this embodiment, N is an integer being greater than or equal to 1. It is noted that the other tuning cells 540-2, 540-3, . . . , and 540-R each may have the same components as those of the tuning cell 540-1. Two nodes PP1 and PP2 are configured to be electrically coupled to adjacent tuning cells. The plurality of RF choking inductors LF are configured to block signals in high frequency bands. In some embodiments, each RF choking inductor LF has inductance that is greater than or equal to 56 nH. The plurality of blocking capacitors CB are configured to block DC (Direct Current) signals. In some embodiments, each blocking capacitor CB has capacitance that is greater than or equal to 33 pF. The plurality of circuit branches BRL-0, BRL-1, . . . , and BRL-N are configured to provide adjustable impedance according to one or more sub-signals S51-1, S51-2, . . . , and S51-N. In an embodiment, the one or more sub-signals S51-1, S51-2, . . . , and S51-N are included in the control signal S51. In other embodiments, the one or more sub-signals S51-1, S51-2, . . . , and S51-N are generated by the selecting circuit 620 according to the setting signal SSI. The circuit branch BRL-0 comprises an inductor L5-0. The circuit branch BRL-1 comprises an inductor L5-1 and two diodes D61 and D62, wherein the inductor L5-1 is electrically coupled to a cathode of the diode D61 and electrically coupled to an anode of the diode D62. Similarly, the circuit branches BRL-2, . . . , and BRL-N comprise inductors L5-2, . . . , and L5-N, respectively. The inductance of the tuning cell 540-1 can be adjusted by turning on or off the diodes D61 and D62 on the circuit branches BRL-1, . . . , and BRL-N via the one or more sub-signals S51-1, S51-2, . . . , and S51-N. It is noted that in the embodiment, since the circuit branches BRL-0, BRL-1, . . . , and BRL-N are electrically coupled in parallel, the effective resistance of them is reduced. The novel tuning cell can improve signal transmission loss in the electronic device of the invention.

Figure 6B:
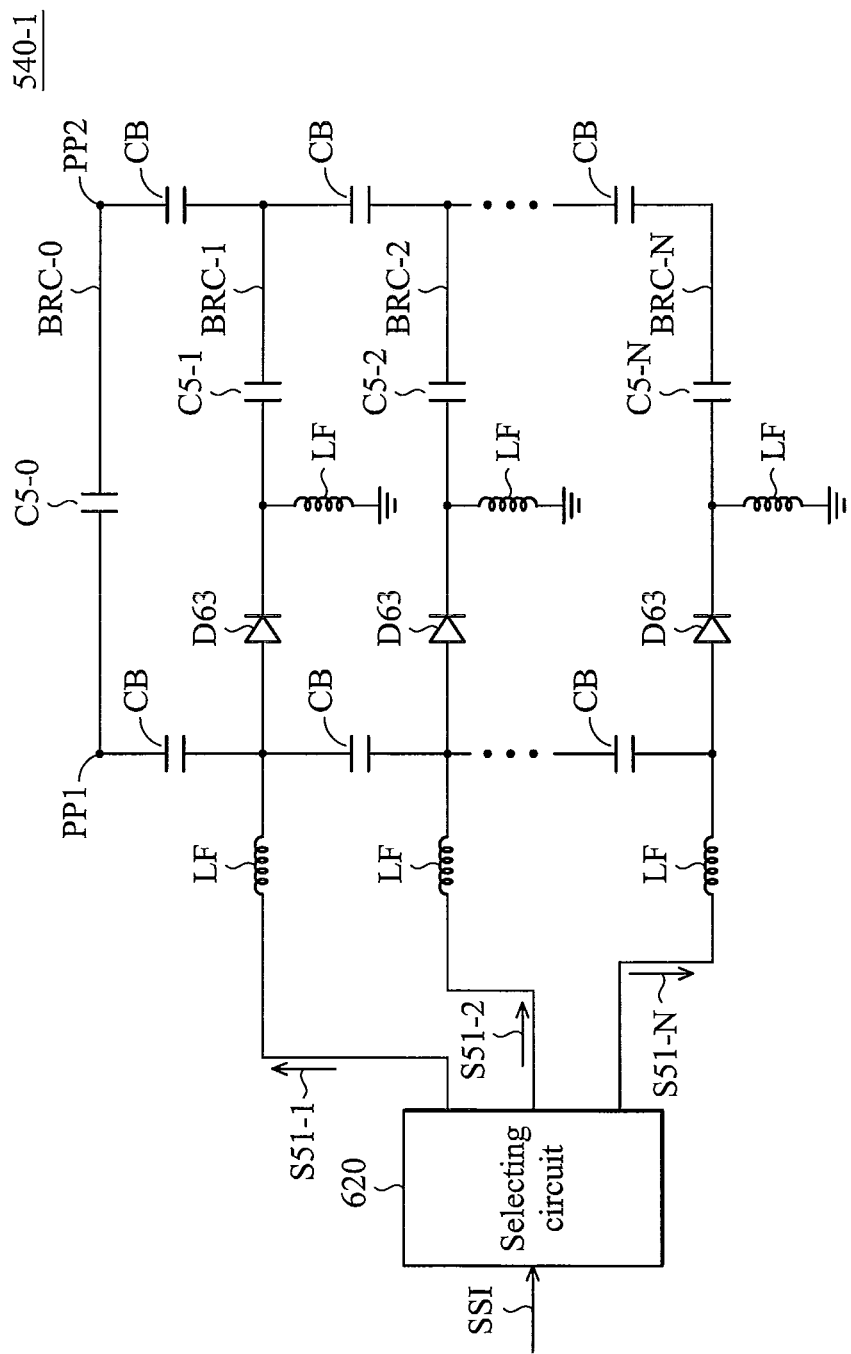
FIG. 6B is a diagram illustrating the tuning cell according to another embodiment of the invention.

FIG. 6B is a diagram illustrating the tuning cell 540-1 according to another embodiment of the invention. As shown in FIG. 6B, the tuning cell 540-1 may comprise a selecting circuit 620, a plurality of circuit branches BRC-0, BRC-1, . . . , and BRC-N, a plurality of RF choking inductors LF, and a plurality of blocking capacitors CB. The plurality of circuit branches BRC-0, BRC-1, . . . , and BRC-N are configured to provide adjustable impedance according to one or more sub-signals S51-1, S51-2, . . . , and S51-N. The circuit branch BRC-0 comprises a capacitor C5-0. The circuit branch BRC-1 comprises a capacitor C5-1, a diode D63, and an RF choking inductor LF, wherein the capacitor C5-1 and the diode D63 are electrically coupled in series, and the RF choking inductor LF is coupled between the cathode of the diode D63 and the ground voltage. Similarly, the circuit branches BRC-2, . . . , and BRC-N comprise inductors C5-2, . . . , and C5-N, respectively. The capacitance of the tuning cell 540-1 can be adjusted by turning on or off the diodes D63 on the circuit branches BRC-1, . . . , and BRC-N via the one or more sub-signals S51-1, S51-2, . . . , and S51-N. It is noted that in the embodiment, since the circuit branches BRC-0, BRC-1, . . . , and BRC-N are electrically coupled in parallel, the effective resistance of them is reduced. The novel tuning cell can improve signal transmission loss in the electronic device of the invention.

Figure 7:
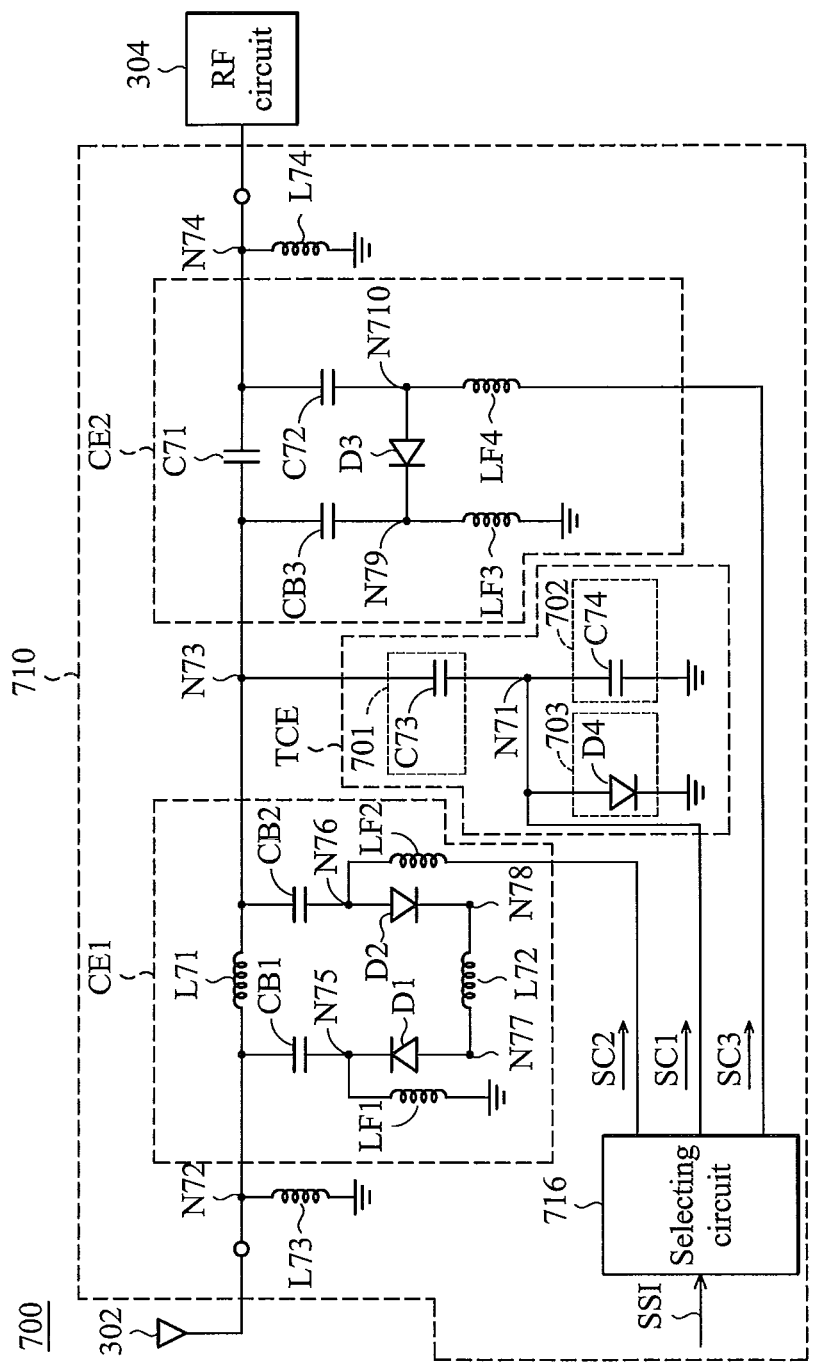
FIG. 7 is a diagram illustrating an electronic device according to another embodiment of the invention.

FIG. 7 is a diagram illustrating an electronic device 700 according to another embodiment of the invention. As shown in FIG. 7, the electronic device 700 comprises an antenna 302, an RF circuit 304, and a matching circuit 710.

The matching circuit 710 is configured to provide variable impedance between the antenna 302 and the RF circuit 304. The antenna 302 is capable of operating in multiple frequency bands according to the variable impedance. The matching circuit 710 comprises a selecting circuit 716, at least one cell CE1 and a tuning cell TCE. The cell CE1 is electrically coupled between the antenna 302 and the RF circuit 304, and it may have an adjustable impedance controlled by the selecting circuit 716. The tuning cell TCE is electrically coupled to the cell CE1, and comprises two tuning elements 701 and 702 and a control element 703. The control element 703 determines whether to make a node N71, which is electrically connected between the tuning elements 701 and 702, coupled to a voltage level according to a control signal SC1 so that the impedance of the tuning cell TCE could be adjusted. In an embodiment, the voltage level is a ground voltage (i.e. 0V). The selecting circuit 716 is configured to generate at least the control signal SC1 according to a setting signal SSI or a default value so as to adjust the impedance of the matching circuit 710 by turning on or off the diode D4 via the control signal SC1. In another embodiment, the selecting circuit 716 is further configured to generate another control signal SC2 so as to adjust impedance of the cell CE1.

The matching circuit 710 may further comprise another cell CE2. In the case, the cell CE1 is electrically coupled between a node N72 and a node N73, and the cell CE2 is electrically coupled between the node N73 and a node N74. The tuning cell TCE is electrically coupled between the node N73 and the voltage level. The node N72 is electrically coupled to the antenna 302, and the node N74 is electrically coupled to the RF circuit 304. In some embodiments, the selecting circuit 716 is further configured to generate a control signal SC3 so as to adjust impedance of the cell CE2.

In an embodiment, the cell CE1 at least comprises two inductors L71 and L72, two blocking capacitors CB1 and CB2, two diodes D1 and D2, and two RF choking inductor LF1 and LF2. The inductor L71 is electrically coupled between the node N72 and the node N73. The blocking capacitor CB1 is electrically coupled between the node N72 and a node N75. The blocking capacitor CB2 is electrically coupled between the node N73 and a node N76. The diode D1 has an anode coupled to a node N77 and a cathode coupled to the node N75. The diode D2 has an anode coupled to the node N76 and a cathode coupled to a node N78. The inductor L72 is electrically coupled between the node N77 and the node N78. The RF choking inductor LF1 is electrically coupled between the node N75 and the voltage level. The RF choking inductor LF2 is electrically coupled to the node N76 and is configured to receive the control signal SC2, which is generated by the selecting circuit 716. Therefore, the impedance of the cell CE1 can be adjusted by turning on or off the diodes D1 and D2 via the control signal SC2. The capacitance of each of the blocking capacitors CB1 and CB2 is greater than 33 pF, and the inductance of each of the RF choking inductors LF1 and LF2 is greater than 56 nH. It is noted that the cell CE1 may comprise more circuit branches, such as the tuning cell 540-1 as shown in FIG. 6A.

In an embodiment, the cell CE2 at least comprises two capacitors C71 and C72, a blocking capacitor CB3, a diode D3, and two RF choking inductor LF3 and LF4. The capacitor C71 is electrically coupled between the node N73 and the node N74. The blocking capacitor CB3 is electrically coupled between the node N73 and a node N79. The capacitor C72 is electrically coupled between the node N74 and a node N710. The diode D3 has an anode coupled to the node N710 and a cathode coupled to the node N79. The RF choking inductor LF3 is electrically coupled between the node N79 and the voltage level. The RF choking inductor LF4 is electrically coupled to the node N710 and is configured to receive the control signal SC3, which is generated by the selecting circuit 716. Therefore, the impedance of the cell CE2 can be adjusted by turning on or off the diode D3 via the control signal SC3. The capacitance of the blocking capacitor CB3 is greater than 33 pF, and the inductance of each of the RF choking inductors LF3 and LF4 is greater than 56 nH. It is noted that the cell CE2 may comprise more circuit branches, such as the tuning cell 540-1 as shown in FIG. 6B.

In an embodiment, the tuning element 701 is a capacitor C73 which is electrically coupled between the node N71 and the node N73, and the tuning element 702 is a capacitor C74, which is electrically coupled between the node N71 and the voltage level. The control element 703 is the diode D4, which has an anode coupled to the node N71 and a cathode coupled to the voltage level. The anode of the diode D4 is also electrically coupled to the selecting circuit 716 so as to receive the control signal SC1. The capacitance of the tuning cell TCE could be adjusted by the control signal SC1. It is noted that the tuning cell may comprise more control elements and more tuning elements, such as the tuning cell 214-1 as shown in FIG. 2B.

In an embodiment, the matching circuit 710 further comprises two inductors L73 and L74. The inductor L73 is electrically coupled between the node N72 and the voltage level, and the inductor L74 is electrically coupled between the node N74 and the voltage level.

In another embodiment, the cell CE1 may include only an inductor, such as the element 312-1 as shown in FIG. 3, and the cell CE2 may include only a capacitor, such as the element 312-2 as shown in FIG. 3. The cell CE1 may be interchanged with the cell CE2. The matching circuit 710 may comprise more cells or more tuning cells, such as the matching circuit 510 as shown in FIG. 5. In other embodiments, one of the cells CE1 and CE2 may be removed, and the inductors L73 and L74 may be removed.

Figure 8:
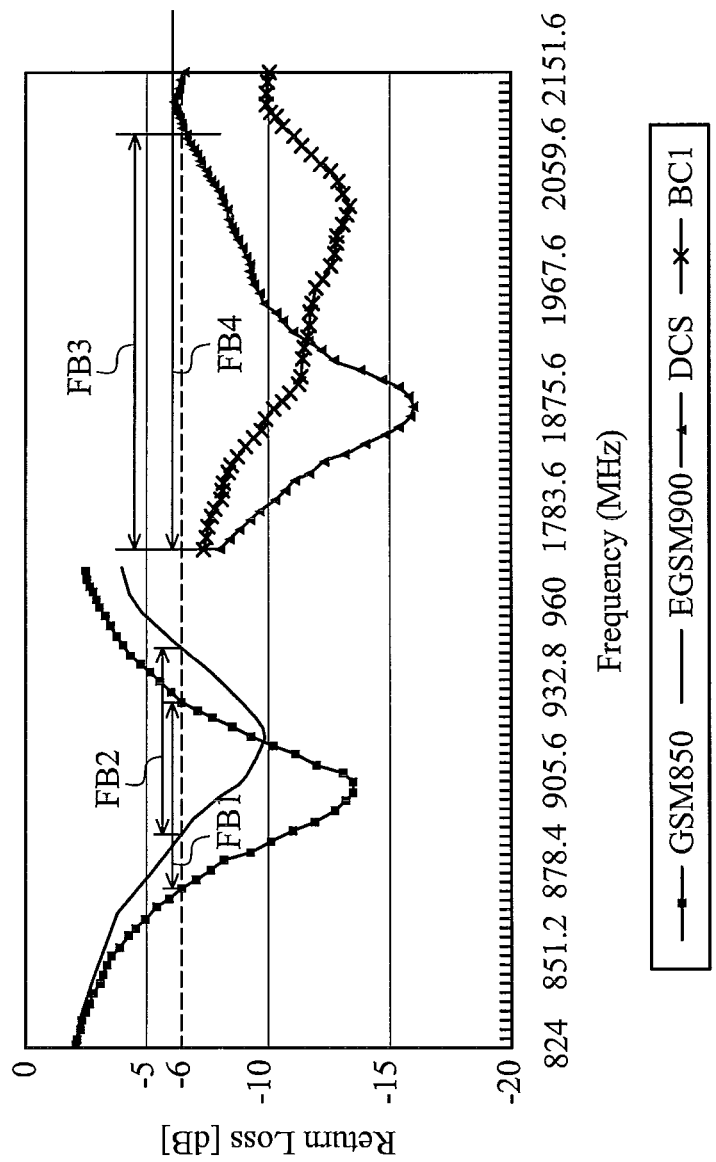
FIG. 8 is a diagram illustrating return loss of the antenna according to an embodiment of the invention.

FIG. 8 is a diagram illustrating return loss of the antenna 302 according to an embodiment of the invention. FIG. 8 is utilized for illustrating measured return loss (unit: dB) over frequency (unit: MHz). The antenna 302 of the electronic device 700 is capable of operating in at least four frequency bands FB1, FB2, FB3 and FB4 according to the variable impedance of the matching circuit 710, wherein the variable impedance is controlled by the control signals SC1, SC2 and SC3. In a preferred embodiment, the frequency band FB1 is approximately from 824 MHz to 894 MHz; the frequency band FB2 is approximately from 880 MHz to 960 MHz; the frequency band FB3 is approximately from 1710 MHz to 1880 MHz; and the frequency band FB4 is approximately from 1920 MHz to 2170 MHz.

TABLE I

Multiple frequency bands of the antenna 302 in FIG. 7

|  | Diode D1 | Diode D2 | Diode D3 | Diode D4 |
| --- | --- | --- | --- | --- |
| FB1 (GSM850) | ON | ON | ON | ON |
| FB2 (EGSM900) | ON | ON | ON | OFF |

TABLE I-continued

Multiple frequency bands of the antenna 302 in FIG. 7

|  | Diode D1 | Diode D2 | Diode D3 | Diode D4 |
|---|---|---|---|---|
| FB3 (DCS1800) | OFF | OFF | ON | ON |
| FB4 (WCDMA BC1) | ON | ON | OFF | ON |

Table I illustrates the relationship between states of the diodes D1, D2, D3 and D4 and the selected frequency band. In the embodiment, the antenna 302 of the electronic device 700 can selectively operate at GSM850, EGSM900, DCS1800, or WCDMA BC1 band according to the control signals SC1, SC2 and SC3. When a control signal or sub-signal generated by a selecting circuit described above is equal to the work voltage VDD, the corresponding diode is turned on. On the contrary, when the control signal is equal to the ground voltage, the corresponding diode is turned off. It is noted that the diodes D1 and D2 are controlled by the same control signal SC2 so that they are turned on or off by the control signal SC2 at the same time.

Figure 9A:
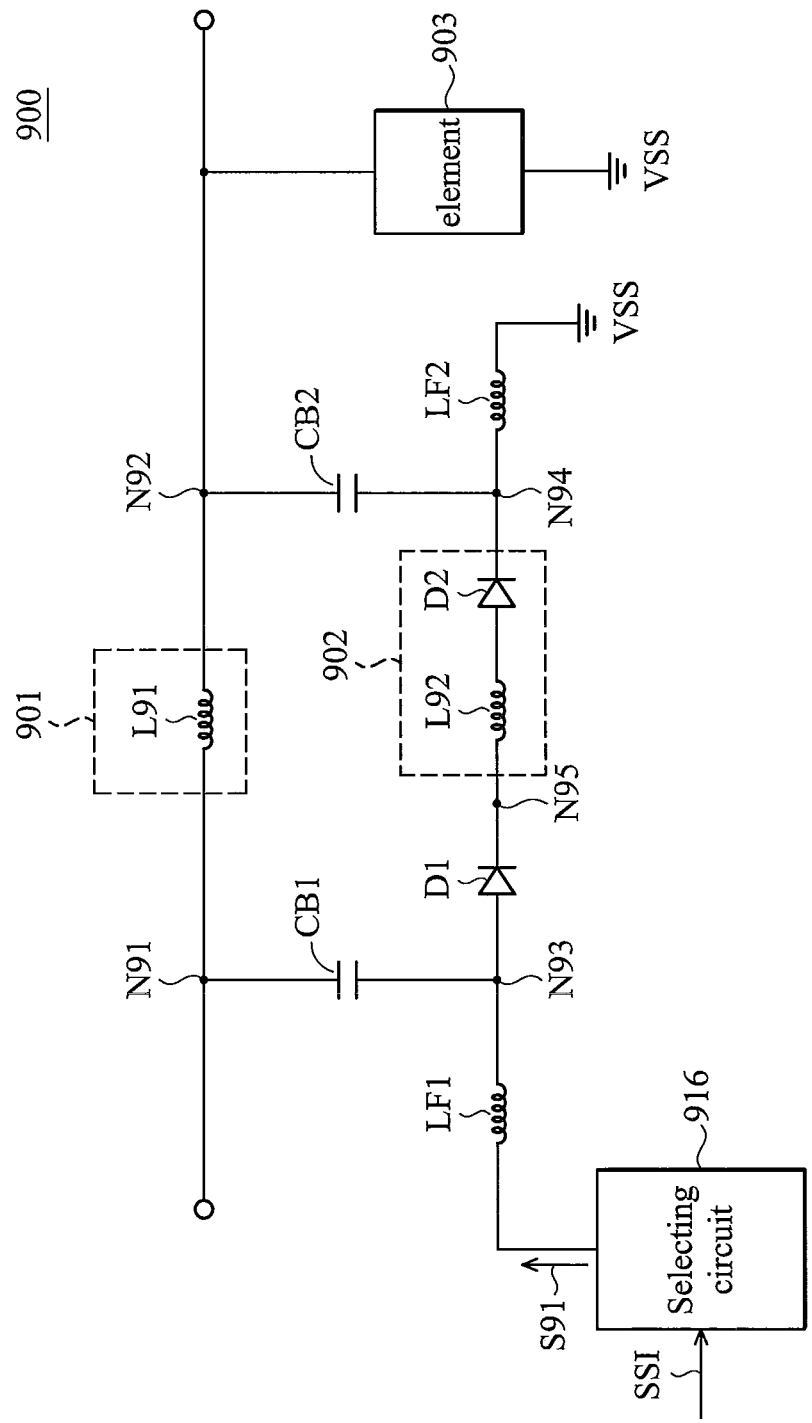
FIG. 9A is a diagram illustrating a matching circuit according to an embodiment of the invention.

FIG. 9A is a diagram illustrating a matching circuit 900 according to an embodiment of the invention. As shown in FIG. 9A, the matching circuit 900 for providing variable impedance between an antenna and an RF circuit comprises three elements 901, 902 and 903, two blocking capacitors CB1 and CB2, two RF choking inductors LF1 and LF2, a diode D1, and a selecting circuit 916. The element 901 is electrically coupled between a node N91 and a node N92, wherein the node N91 is electrically coupled to the antenna and the node N92 is electrically coupled to the RF circuit. The blocking capacitor CB1 is electrically coupled between the node N91 and a node N93. The blocking capacitor CB2 is electrically coupled between the node N92 and a node N94. The diode D1 has an anode coupled to the node N93 and a cathode coupled to a node N95. The element 902 is electrically coupled between the node N94 and the node N95. The RF choking inductor LF1 is electrically coupled to the node N93, and is configured to receive a control signal S91. The element 901 may be an inductor L91. The element 902 may comprise an inductor L92 coupled to the node N95, and a diode D2 having an anode coupled to the inductor L92 and a cathode coupled to the node N94. The selecting circuit 916 is electrically coupled to the RF choking inductor LF1, and is configured to generate the control signal S91 so as to adjust the impedance of the matching circuit 900 by turning on or off the diodes D1 and D2 via the control signal S91. The RF choking inductor LF2 is electrically coupled between the node N94 and a ground voltage VSS. The element 903 is electrically coupled to the node N92. The element 903 may comprise one or more capacitors, inductors or resistors, or it may be another tuning cell with adjustable impedance controlled by the selecting circuit 916. Similarly, the capacitance of each of the blocking capacitors CB1 and CB2 is greater than 33 pF, and the inductance of each of the RF choking inductors LF1 and LF2 is greater than 56 nH. Except for the element 903, the matching circuit 900 is a simplification of the tuning cell 540-1 (N=1) as shown in FIG. 6A.

Figure 9B:
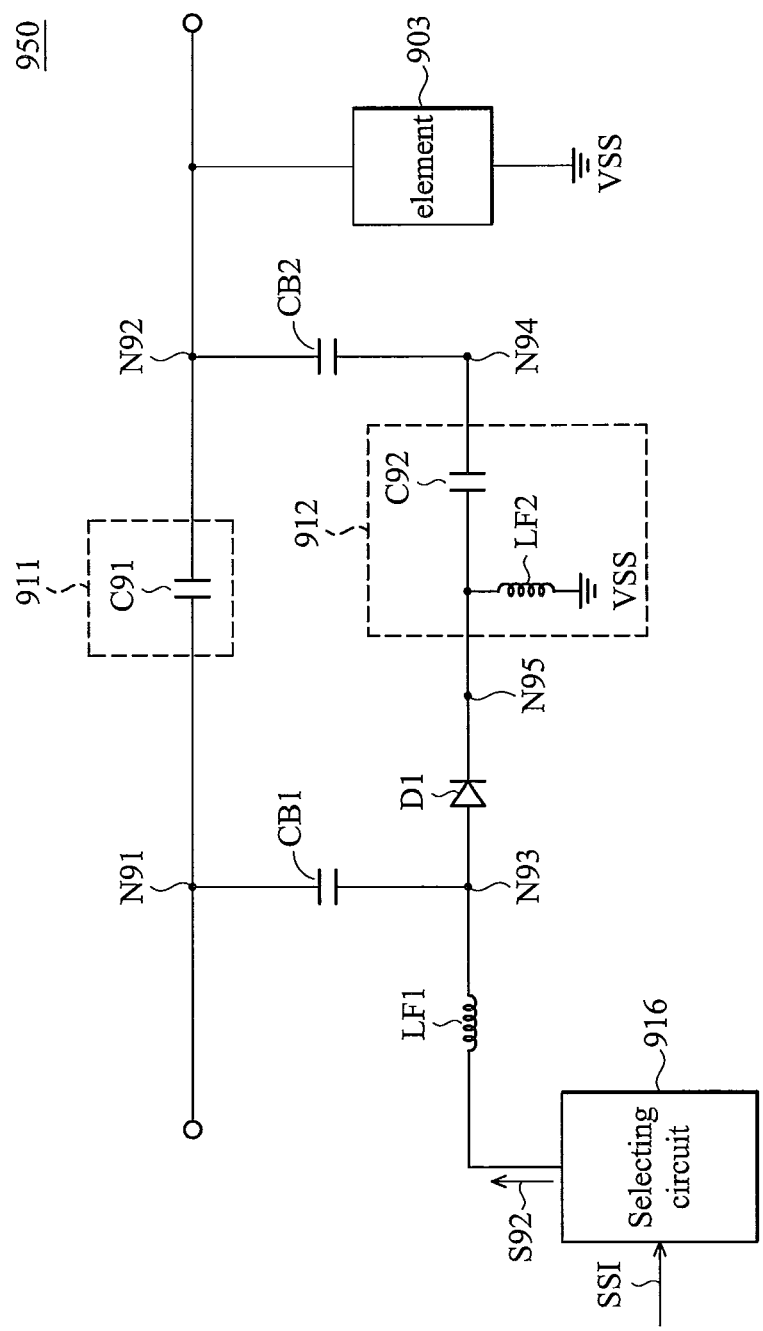
FIG. 9B is a diagram illustrating a matching circuit according to another embodiment of the invention.

FIG. 9B is a diagram illustrating a matching circuit 950 according to another embodiment of the invention. The matching circuit 950 is similar to the matching circuit 900 as shown in FIG. 9A. The difference between them is as follows. The element 911 is a capacitor C91. The element 912 comprises a capacitor C92 coupled between the node N94 and the node N95, and the RF choking inductor LF2 coupled between the node N95 and the ground voltage VSS. In this embodiment, the impedance of the matching circuit 950 can be adjusted by turning on or off the diode D1 via a control signal S92 generated by the selecting circuit 916. Except for the element 903, the matching circuit 950 is a simplification of the tuning cell 540-1 (N=1) as shown in FIG. 6B.

The invention provides matching circuits and electronic devices with the same. The matching circuit of the invention provides variable impedance so as to select frequency bands of an antenna. In preferred embodiments, the matching circuit comprises tuning cells with circuit branches coupled in parallel. Therefore, the resistance caused by these circuit branches is effectively reduced. This solves the problem of signal transmission loss in traditional receivers or transmitters.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device for processing radio frequency (RF) signals, comprising:
    an antenna;
    an RF circuit; and
    a matching circuit configured to provide variable impedance between the antenna and the RF circuit, wherein the antenna is capable of operating in multiple frequency bands according to the variable impedance, and wherein the matching circuit comprises:
        a first cell coupled between the antenna and the RF circuit;
        a tuning cell coupled to the first cell, and comprising a first tuning element, a second tuning element and a control element, wherein the control element determines whether to make a first node connected between the first and second tuning elements couple to a voltage level according to a first control signal; and
        a selecting circuit coupled to the control element and configured to generate the first control signal to adjust the variable impedance.

2. The electronic device as claimed in claim 1, wherein the selecting circuit is further configured to generate a second control signal to adjust first impedance of the first cell.

3. The electronic device as claimed in claim 2, wherein the first cell comprises:
    a first inductor coupled between the second node and the third node;
    a first blocking capacitor coupled between the second node and a fifth node;
    a second blocking capacitor coupled between the third node and a sixth node;
    a first diode having an anode coupled to a seventh node and a cathode coupled to the fifth node;
    a second diode having an anode coupled to the sixth node and a cathode coupled to an eighth node;

a second inductor coupled between the seventh node and the eighth node;

a first RF choking inductor coupled between the fifth node and the voltage level; and a second RF choking inductor coupled to the sixth node and receiving the second control signal.

4. The electronic device as claimed in claim 1, further comprising:

a second cell, wherein the first cell is coupled between a second node and a third node, wherein the second cell is coupled between the third node and a fourth node, wherein the tuning cell is coupled between the third node and the voltage level, and wherein the second node is coupled to the antenna and the fourth node is coupled to the RF circuit.

5. The electronic device as claimed in claim 4, wherein the selecting circuit is further configured to generate a third control, signal to adjust second impedance of the second cell.

6. The electronic device as claimed in claim 5, wherein the second cell comprises:

a first capacitor coupled between the third node and the fourth node;

a third blocking capacitor coupled between the third node and a ninth node;

a second capacitor coupled between the fourth node and a tenth node;

a third diode having an anode coupled to the tenth node and a cathode coupled to the ninth node;

a third RF choking inductor coupled between the ninth node and the voltage level; and a fourth RF choking inductor coupled to the tenth node and receiving the third control signal.

7. The electronic device as claimed in claim 5, wherein the antenna is capable of operating in a first frequency band, a second frequency band, a third frequency band, or a fourth frequency band according to the variable impedance, which is adjusted by the first, second and third control signals.

8. The electronic device as claimed in claim 7, wherein the first frequency band is approximately from 824 MHz to 894 MHz, wherein the second frequency band is approximately from 880 MHz to 960 MHz, wherein the third frequency band is approximately from 1710 MHz to 1880 MHz, and wherein the fourth frequency band is approximately from 1920 MHz to 2170 MHz.

9. The electronic device as claimed in claim 4, wherein the first tuning element is a third capacitor coupled between the first node and the third node, wherein the second tuning element is a fourth capacitor coupled between the first node and the voltage level, wherein the control element is a fourth diode having an anode coupled to the first node and a cathode coupled to the voltage level, and wherein the anode of the fourth diode is coupled to the selecting circuit to receive the first control signal.

10. The electronic device as claimed in claim 4, further comprising:

a third inductor coupled between the second node and the voltage level.

11. The electronic device as claimed in claim 4, further comprising:

a fourth inductor coupled between the fourth node and the voltage level.

12. The electronic device as claimed in claim 4, wherein the voltage level is a ground voltage.

13. A matching circuit for providing variable impedance between an antenna and an RF circuit, comprising:

a first element coupled between a first node and a second node, wherein the first node is coupled to the antenna and the second node is coupled to the RF circuit;

a first blocking capacitor coupled between the first node and a third node;

a second blocking capacitor coupled between the second node and a fourth node;

a first diode having an anode coupled to the third node and a cathode coupled to a fifth node;

a second element coupled between the fourth node and the fifth node;

a first RF choking inductor coupled to the third node, and receiving a control signal;

a selecting circuit coupled to the first RF choking inductor, and generating the control signal to adjust the variable impedance; and a third element coupled to the second node.

14. The matching circuit as claimed in claim 13, further comprising:

a second RF choking inductor coupled between the fourth node and a ground voltage.

15. The matching circuit as claimed in claim 13, wherein the first element is a first inductor, and wherein the second element comprises:

a second inductor coupled to the fifth node; and a second diode having an anode coupled to the second inductor and a cathode coupled to the fourth node.

16. The matching circuit as claimed in claim 13, wherein the first element is a first capacitor, and the second element comprises:

a second capacitor coupled between the fourth node and the fifth node; and a second RF choking inductor coupled between the fifth node and a ground voltage.

* * * * *